United States Patent
Yoon et al.

(10) Patent No.: US 8,981,357 B2
(45) Date of Patent: Mar. 17, 2015

(54) DOPED GRAPHENE STRUCTURE COMPRISING HYDROPHOBIC ORGANIC MATERIAL, METHOD FOR PREPARING THE SAME, AND TRANSPARENT ELECTRODE, DISPLAY DEVICE AND SOLAR CELL COMPRISING THE ELECTRODE

(71) Applicant: Samsung Electronics Co., Ltd., Suwon-Si, Gyeonggi-Do (KR)

(72) Inventors: Seon-mi Yoon, Yongin-si (KR); Hyeon-jin Shin, Suwon-si (KR); Jae-young Choi, Suwon-si (KR); Won-mook Choi, Hwaseong-si (KR); Soo-min Kim, Seoul (KR); Young-hee Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/847,772

(22) Filed: Mar. 20, 2013

(65) Prior Publication Data

US 2014/0110670 A1  Apr. 24, 2014

(30) Foreign Application Priority Data

Oct. 23, 2012 (KR) .................... 10-2012-0117905

(51) Int. Cl.
*H01L 29/16* (2006.01)
*H01L 21/04* (2006.01)

(52) U.S. Cl.
CPC ........ *H01L 29/1606* (2013.01); *H01L 21/0405* (2013.01); *H01L 21/04* (2013.01); *H01L 29/16* (2013.01); *Y02E 10/50* (2013.01)
USPC ............................................. 257/40; 438/542

(58) Field of Classification Search
CPC .................... H01L 29/1606; H01L 29/66015; H01L 2924/13088
USPC ........................................................... 257/40
See application file for complete search history.

(56) References Cited

U.S. PATENT DOCUMENTS

2009/0071533 A1* 3/2009 Choi et al. .................... 136/252
2009/0146111 A1* 6/2009 Shin et al. ..................... 252/510
2010/0084008 A1* 4/2010 Kim et al. ..................... 136/252
2011/0017979 A1  1/2011 Meric et al.

(Continued)

FOREIGN PATENT DOCUMENTS

KR  2009-0126057 A  12/2009
KR  2011-0016287 A   2/2011

(Continued)

OTHER PUBLICATIONS

Park et al. Doped graphene electrodes for organic solar cells, Nov. 23, 2010, stacks.iop.org/Nano/21/505204.*

(Continued)

*Primary Examiner* — Whitney T Moore
(74) *Attorney, Agent, or Firm* — Harness, Dickey & Pierce, P.L.C.

(57) ABSTRACT

A hydrophobic organic layer may be formed on a surface of a graphene doped with a dopant to improve stability of the doped graphene with respect to moisture and temperature. Thus, the transparent electrode having the doped graphene containing the hydrophobic organic layer may be usefully applied in solar cells or display devices.

21 Claims, 2 Drawing Sheets

(56) References Cited

U.S. PATENT DOCUMENTS

2012/0080086 A1 4/2012 Yoon et al.
2012/0261167 A1 10/2012 Sung

FOREIGN PATENT DOCUMENTS

| KR | 2011-0133354 A | 12/2011 |
|---|---|---|
| KR | 2012-0035841 A | 4/2012 |
| WO | WO-2012-064285 A1 | 5/2012 |

OTHER PUBLICATIONS

International Search Report dated Dec. 16, 2013 issued in corresponding PCT Application No. PCT/KR2013/009245.
W. C. Shin, et al.: "Highly air-stable electrical performance of graphene field effect transistors by interface engineering with amorphous fluoropolymer"; Applied Physics Letters, vol. 98, pp. 153505-1 to 153505-3; 2011.
Y. Liu, et al.: "Stable Nafion-functionalized graphene dispersions for transparent conducting films"; Nanotechnology, vol. 20, pp. 1-7; 2009.
J. Hong, et al.: "Hydrophobic properties of colloidal films coated with multi-wall carbon nanotubes/reduced graphene oxide multilayers"; Colloids and Surfaces A: Physicochemical and Engineering Aspects, vol. 374, pp. 54-57; 2011.
J. Rafiee, et al.: "Superhydrophobic to Superhydrophilic Wetting Control in Graphene Films"; Advanced Materials, vol. 22, pp. 2151-2154; 2010.
S. Ansari, et al. "Functionalized Graphene Sheet—Poly(vinylidene fluoride) Conductive Nanocomposites"; Journal of Polymer Science Part B: Polymer Physics, vol. 47, pp. 888-897; 2009.

* cited by examiner

DOPED GRAPHENE STRUCTURE COMPRISING HYDROPHOBIC ORGANIC MATERIAL, METHOD FOR PREPARING THE SAME, AND TRANSPARENT ELECTRODE, DISPLAY DEVICE AND SOLAR CELL COMPRISING THE ELECTRODE

CROSS-REFERENCE TO RELATED APPLICATION

This application claims the benefit of Korean Patent Application No. 10-2012-0117905, filed on Oct. 23, 2012, in the Korean Intellectual Property Office, the disclosure of which is incorporated herein in its entirety by reference.

FIELD

Example embodiments relate to a doped graphene structure including a hydrophobic organic material, a process of preparing the same, and a transparent electrode, display device and solar cell including the doped graphene structure, and more particularly, to a doped graphene structure having improved stability with respect to moisture and temperature by allowing a hydrophobic organic material to be contained in a doped graphene, a method of preparing the same, and a transparent electrode, display device and solar cell including the doped graphene structure.

DESCRIPTION OF THE RELATED ART

Display devices or various devices, e.g., a solar cell, need a transparent electrode, which is made of representatively indium tin oxide (ITO). However, in the case of ITO, as consumption of indium increases, price of indium may rise due to the fear of resource exhaustion, and insufficient ductility, which is one characteristic of an ITO electrode, causes cracks to be generated and bending, thereby increasing resistance. Therefore, there is a need to develop an electrode material that may substitute ITO, and studies on graphene as an alternative have been performed.

Because graphene itself has a metal property or a semiconductor property, sheet resistance of the graphene may be decreased by adjusting carrier density via electron transfer through non-chemical coupling of dopants. However, because most dopants used for doping graphene have hydrophilicity, a doped graphene exhibits a hydrophilic surface characteristic due to charge transfer after being doped. Thus, the surface of the doped graphene having the hydrophilicity may be degenerated due to adsorption of moisture as being exposed to air.

SUMMARY

Example embodiments provide graphene structures including a doped graphene with improved stability with respect to moisture and temperature. Example embodiments also provide methods of preparing a graphene structure. Example embodiments also provide transparent electrodes, display devices and solar cells with a graphene structure.

According to example embodiments, a graphene structure may include a graphene doped with a dopant; and a hydrophobic organic layer formed on at least one surface of the doped graphene.

According to example embodiments, a transparent electrode may include the graphene structure of example embodiments on at least one surface of a transparent substrate.

According to example embodiments, a display device and/or a solar cell may include the transparent electrode.

According to example embodiments, a method of preparing a graphene structure may include doping a graphene with a dopant solution, and forming a hydrophobic organic layer on the doped graphene.

According to example embodiments, a method of preparing a transparent electrode may include transferring a graphene on at least one surface of a transparent substrate, doping the graphene with a dopant solution, and forming a hydrophobic organic layer on the doped graphene.

According to example embodiments, a method of preparing a display device and/or a solar cell may include the method of preparing the transparent electrode.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
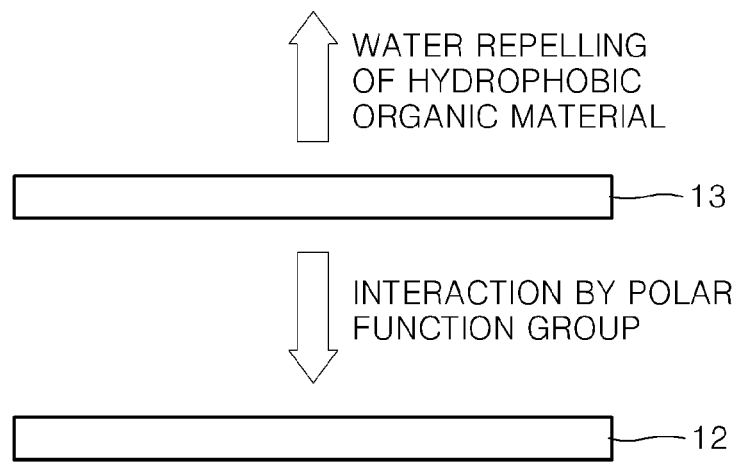
FIG. 1 is a conceptual view of a doped graphene structure and shows interactions between a doped graphene and a hydrophobic organic layer.

Reference will now be made in detail to embodiments, examples of which are illustrated in the accompanying drawings, wherein like reference numerals refer to the like elements throughout. In this regard, example embodiments may have different forms and should not be construed as being limited to the descriptions set forth herein. Accordingly, the embodiments are merely described below, by referring to the figures, to explain aspects of the present description.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

In example embodiments, a doped graphene structure may include a graphene doped with a dopant, and a hydrophobic organic layer formed on at least one surface of the graphene.

The hydrophobic organic layer is formed on at least one surface of the doped graphene such that hydrophobicity is imparted to the surface of the doped graphene.

Because most dopants conventionally used for doping graphene are hydrophilic, when the doped graphene is exposed to atmosphere, for example, a relatively high temperature and humidity atmosphere, the doped graphene adsorbs moisture, so that degeneration of various characteristics in the doped graphene occurs. For example, decomposition of dopants, change in the structure of dopants, etc. may occur to cause electrical characteristics to be reduced.

To prevent or inhibit such a degeneration, a hydrophobic organic layer may be formed on at least one surface of the doped graphene to impart hydrophobicity to the surface of the doped graphene, and the amount of moisture adsorbed into the doped graphene may be decreased to thus prevent or inhibit electrical characteristics of the doped graphene from being reduced.

As the hydrophobic organic layer disposed on the doped graphene, hydrophobic organic materials having a polar functional group, for example, a carbon-based material having hydrophobicity, may be used without any limitation. For example, a fluorocarbon-based material may be used in the hydrophobic organic layer.

Generally, when considering characteristics of the doped graphene having a polarity, if a polar functional group is provided to a fluorocarbon-based material used in the hydrophobic organic layer, a more uniform coating may be obtained. As shown in FIG. 1, because a polar functional group contained in the hydrophobic organic layer 13 has a relatively high hydrophilicity like a doped graphene 12, the polar function group interacts with the doped graphene 12, but because the hydrophobic organic layer 13 has no affinity to the doped graphene, the hydrophobic organic layer 13 does not interact with the doped graphene 12 to repel water.

Examples of the polar function group may include, but not be limited to, a halogen atom, a substituted or unsubstituted ether group having 1 to 20 carbon atoms, a substituted or unsubstituted alkylcarbonyloxy group having 2 to 20 carbon atoms, a substituted or unsubstituted aryloxy group having 6 to 30 carbon atoms, a carbonyloxy group, a cyano group, an amide group, an imide group, a silyl group, and an alkoxy silane.

The ether group is a substituent group having a structure of R—O—R′—, and may have a straight or branched structure, where R represents an alkyl group or an alkenyl group, and R′ represents an alkylene group, an alkenylene group or an alkyl group. Alkyl groups containing 1 to 6 carbon atoms, or 1 to 4 carbon atoms, or 1 to 3 carbon atoms, for example, a methyl group, an ethyl group, a propyl group, an isopropyl group, an n-butyl group, an s-butyl group, an isobutyl group, a t-butyl group, an n-pentyl group, and an n-hexyl group may be used as the alkyl group. One or more hydrogen atoms existing in the ether group may be each independently substituted with a halogen alkenyl group, an alkynyl group, a haloalkenyl group, a haloalkynyl group, an aryl group, a haloaryl group, an aralkyl group, a haloaralkyl group, an alkoxy group, a haloalkoxy group, a carbonyloxy group, a halocarbonyloxy group, an aryloxy group, a haloaryloxy group, a silyl group, or a siloxy group.

The aryloxy group may be a substituent group having a structure of aryl-O—, may have a straight or branched structure, and the aryl may contain 6 to 30 carbon atoms, 6 to 20 carbon atoms, or 6 to 12 carbon atoms. Examples of the aryl group may include a phenyl group, a naphthyl group, anthryl group, a penanthryl group, and a biphenyl group. One or more hydrogen atoms existing in the aryloxy group may be each independently substituted with a halogen alkenyl group, an alkynyl group, a haloalkenyl group, a haloalkynyl group, an aryl group, a haloaryl group, an aralkyl group, a haloaralkyl group, an alkoxy group, a haloalkoxy group, a carbonyloxy group, a halocarbonyloxy group, an aryloxy group, a haloaryloxy group, a silyl group, or a siloxy group.

The alkylcarbonyloxy group may be a substituent group having a structure of alkyl-(C=O)—O—, and may have a straight or branched structure. Alkyl groups containing 1 to 6 carbon atoms, or 1 to 4 carbon atoms, or 1 to 3 carbon atoms, for example, a methyl group, an ethyl group, a propyl group, an isopropyl group, an n-butyl group, an s-butyl group, an isobutyl group, a t-butyl group, an n-pentyl group, and an n-hexyl group may be used as the alkyl group. One or more hydrogen atoms existing in the alkylcarbonyloxy group may be each independently substituted with a halogen alkenyl group, an alkynyl group, a haloalkenyl group, a haloalkynyl group, an aryl group, a haloaryl group, an aralkyl group, a haloaralkyl group, an alkoxy group, a haloalkoxy group, a carbonyloxy group, a halocarbonyloxy group, an aryloxy group, a haloaryloxy group, a silyl group, or a siloxy group.

Concrete examples of the organic material used in the hydrophobic organic layer may include perfluorodecylalkoxy silane, poly(vinylidene fluoride-co-hexafluoropropylene) (PVdF-HFP), $F(CF_2)_x(CH_2CH_2O)_yH$ (where x is a number from 2 to 18, and y is a number from 1 to 15), $F(CF_2)_{x'}CH_2CH_2OOCC(CH_3)=CH_2$ (where x' is a number from 2 to 18), $F(CF_2)_{x''}CH_2CH_2OOCC_{17}H_{35}$ (where x" is a number from 2 to 18), and $(F(CF_2)x'''CH_2CH_2OOC)_3C_3H_5O$ (where x''' is a number from 2 to 18).

An example of $F(CF_2)_x(CH_2CH_2O)_yH$ may be $F(CF_2)_xCH_2CH_2OH$ (where x is a number from 2 to 18).

Examples of the perfluorodecylalkoxy silane may include heptadecafluorodecyltrimethoxysilane, and heptadecafluorodecyltriethoxysilane.

The above-mentioned hydrophobic organic layer may be disposed on a surface of the doped graphene, and may have a thickness of about 300 nm or less, for example, a thickness ranging from about 1 nm to about 300 nm or about 5 nm to about 200 nm.

The doped graphene having the hydrophobic organic layer thereon may be obtained by doping a dopant, for example, a p-dopant into the graphene, and the dopant is doped into the graphene by causing an electrical interaction due to a potential difference with the graphene, to thus increase the carrier density and decrease the sheet resistance of the graphene (e.g., to increase the conductivity).

When the dopant is introduced in order to decrease the sheet resistance, the transmittance of a film may be decreased by the dopant adsorbed into the graphene, so that a trading off between the transmittance and the conductivity may be generated. That is, in the case where a relatively large amount of dopant is used to decrease the sheet resistance (or to increase the conductivity), the transmittance may be reduced to cause a reduction of photoconversion efficiency. Also, in the case where a relatively small amount of dopant is used to maintain the transmittance, achieving a targeted reduction of conductivity may be difficult.

Therefore, the dopant may be used within a range able to maintain the transmittance at a level of not less than a predetermined or given level, for example, at a level of about 75% or more, e.g., in a range of 85% to 99%.

The dopant may be used without any limitation if it is usable to dope the graphene. The dopant may be a p-dopant, which is, for example, at least one selected from ionic liquids (e.g., $NO_2BF_4$, $NOBF_4$, and $NO_2SbF_6$ (nitronium hexafluoroantimonate (NHFA)), acids (e.g., HCl, $H_2PO_4$, $CH_3COOH$, $H_2SO_4$, and $HNO_3$), organic materials (e.g., dichlorodicyanoquinone (DDQ), potassium peroxymonopersulfate ($2KHSO_5 \cdot KHSO_4 \cdot K_2SO_4$), dimyristoylphosphatidylinositol (DMPI), and trifluoromethanesulfonimide), and inorganic materials (e.g., $HPtCl_4$, $AuCl_3$, $HAuCl_4$, AgOTfs (Silver trifluoromethanesulfonate), $AgNO_3$, $H_2PdCl_6$, $Pd(OAc)_2$, and $Cu(CN)_2$).

Other examples of the dopant may include acids, for example, organic acids or inorganic acids, and the organic acids or the inorganic acids may contain metal ions. The metal ions may be used to substitute hydrogen ions contained in the organic acids or the inorganic acids, or may be contained in the form of metal complexes. Such an organic acid or inorganic acid may have a molecular weight of not less than about 120.

The metal ion may be a metal ion that does not generate a transition between d-orbital functions causing light absorption in a visible light region, for example, a metal ion of which a d-orbital function is completely filed with electrons. Thus, examples of the metal ion of which a d-orbital function is completely filled may include $Ag^+$, $Zn^{2+}$, $Ce^{3+}$, $K^+$, lanthanide group metal ions, and actinide group metal ions.

The organic acid means a compound consisting of carbon, hydrogen, and oxygen, the hydrogen atom in the compound may be substituted with a halogenated atom, and all bonds between carbons contained in the compound may be formed in a single bond. When the bond between carbon atoms is a single bond, a transition, e.g., $\pi \rightarrow \pi^*$, $n \rightarrow \pi^*$, is not generated to suppress light absorbance in a visible light region, thus preventing or inhibiting a reduction of transmittance.

Organic materials containing an electron withdrawing group may be used as the organic acid, and examples of the organic acid may include, but not be limited to, an oxalic acid-based organic acid, a lactic acid-based organic acid, a propionic acid-based organic acid, an acetic acid-based organic acid, a citric acid-based organic acid, a trifluoroacetate-based organic acid, or any combination of one or more thereof.

Examples of the oxalic acid-based organic acid may include oxalyl chloride and oxalyl bromide. Examples of the lactic acid-based organic acid may include a silver lactate. Examples of the propionic acid-based organic acid may include a silver pentafluoropropionate. Examples of the acetic acid-based organic acid may include a methyl chlorooxoacetate and an ethyl chlorooxoacetate. Examples of the citric acid-based organic acid may include a citric acid, a lithium citrate, a potassium citrate, and a zinc citrate. Example of the trifluoroacetate-based organic acid may include a cesium trifluoroacetate, an ethyl trifluoroacetate, a trifluoroacetic acid anhydride, a silver trifluoroacetate, an anhydride ($CF_3SO_3COCF_3$) of a trifluoroacetic acid and a trifluoromethansulfonic acid.

Examples of the inorganic acid that is a dopant doped into the graphene may be materials containing an electron withdrawing group, and include, but not be limited to, a triflate ($CF_3SO_3^-$)-based inorganic acid, a sulfonimide-based inorganic acid, a sulfonamide-based inorganic acid, a tetrafluoroborate-based inorganic acid, a perchlorate-based inorganic acid, a hexafluorophosphate-based inorganic acid, a fluoroantimonic acid-based inorganic acid, a silver-based inorganic acid, and a tellurium-based inorganic acid.

Examples of the triflate-based inorganic acid may include a silver trifluoromethanesulfonate, a scandium (III) triflate, and a trifluoromethanesulfonic acid anhydride.

Examples of the sulfonimide-based inorganic acid may include bis(trifluoromethane)sulfonimide (($CF_3SO_2)_2NH$), bis(trifluoromethane)sulfonimide lithium salt, silver bis(trifluoromethane sulfonimide), and bis(pentafluoroethylsulfonyl)imide, nitrocyl bis(trifluoromethane)sulfonimide.

Examples of the sulfonamide-based inorganic acid may include trifluoromethanesulfonamide and 2,2,2-trichloroetoxysulfonamide.

Examples of the tetrafluoroborate-based inorganic acid may include nitrocyl tetrafluoroborate, nitronium tetrafluoroborate, and silver tetrafluoroborate.

Examples of the perchlorate-based inorganic acid may include silver perchlorate. Examples of the hexafluorophosphate-based inorganic acid may include potassium hexafluorophosphate, silver hexafluorophosphate, hexafluorophosphoric acid, and lithium hexafluorophosphate.

Examples of the fluoroantimonic acid-based inorganic acid may include fluoroantimonic acid ($HSbF_6$), nitronium hexafluoroantimonate, nitrosonium hexafluoroantimonate, potassium hexafluoroantimonate, fluorosulfuric acid-antimony pentafluoride, and silver hexafluoroantimonate.

Examples of the inorganic acid containing a silver ion may include silver nitrate, silver sulfate, silver thiocyanate, silver hexafluorophosphate, silver hexafluoroantimonate, silver hexafluoroarsenate, silver cyanide, silver tetrafluoroborate, and silver perchlorate. Examples of the tellurium-based inorganic acid may include a teflic acid and a telluric acid.

The above-described inorganic acids may contain a carbon atom that is a saturated carbon (e.g., forming only a single bond) as a constituent element. In the case of an unsaturated carbon, for example, a carbon atom having a double bond or a triple bond contained in the inorganic acid, light absorption may occur in a visible light region due to a transition, e.g., $\pi \rightarrow \pi^*$, or $n \rightarrow \pi^*$, leading to a reduction of transmittance of the graphene. Therefore, in the case of using an inorganic acid which does not contain an unsaturated carbon as a dopant, light absorption may be suppressed to prevent or inhibit transmittance from being reduced.

The above-described organic acids or inorganic acids may be used alone or in any combinations of two or more thereof.

The dopant described above may be doped into the graphene at a desirable amount, and when transmittance, sufficient doping effect, and economic feasibility are considered, the dopant may be doped to an amount of, for example, about 0.000025 mmol/cm$^2$ to about 0.0175 mmol/cm$^2$ with respect to a monolayer graphene (size: 1 cm 1 cm), for example, about 0.000125 mmol/cm$^2$ to about 0.00875 mmol/cm$^2$.

The graphene doped with a dopant may have a sheet resistance of not more than about 500Ω/□, for example, ranging from about 1Ω/□ to about 500Ω/□.

The term "graphene" means a polycyclic aromatic molecule that is formed by a plurality of carbon atoms covalently bonded, and the covalently bonded carbon atoms form 6-membered rings as a basic repeating unit, but may further include 5- and/or 7-membered rings. Therefore, the graphene is shown to be a monolayer of carbon atoms (typically, sp$^2$ bond) covalently bonded. The graphene may have various structures, which vary with the amount of 5- and/or 7-membered rings. The graphene may be formed in a monolayer, or in a multi-layer in which a plurality of monolayers are stacked.

A sheet-shaped graphene prepared by a known method may be used as the doped graphene. For example, a graphene sheet may be obtained by thermally annealing a sheet-shaped graphite catalyst together with a vapor phase or liquid phase carbon source at a predetermined or given temperature to form a graphene sheet and separating the formed graphene sheet, or may be formed directly on a substrate by thermally annealing a carbon-containing substrate, for example, a Si—C substrate at a predetermined or given temperature.

According to example embodiments, in consideration of an inherent light transmittance of the graphene, for example, one layer to ten layers, or for example, one layer to four layers, of graphene may be used. The number of layers constituting the graphene may be selected to have a desirable light transmittance according to the use of the graphene. A two or more layered graphene may be formed by sequentially stacking two or more graphenes each having a monolayer structure. When a dopant is doped into a multi-layered graphene, the dopant may exist between layers of the multilayered graphene.

The doping process of the graphene with a dopant may be performed using a dopant solution. An available dopant solution may be a solution in which at least one of the above-described dopants is dissolved or dispersed in a polar solvent. The polar solvent has a dielectric constant of not less than 5, and may include, for example, water, nitro methane, dimethylformamide, N-methyl-2-pyrrolidinone, tetrahydrofuran, acetonitrile, dimethyl sulfoxide, and ethanol.

The dopant solution concentration may determine the amount of a dopant doped into the graphene, and in consideration of a sufficient doping effect and economic feasibility, may be in a range of about 0.001 M to about 0.1 M, for example, about 0.005 M to about 0.05 M. If the number of layers constituting the graphene is increased, the concentration of a dopant solution to be used may also be increased.

The doping process of the dopant solution into the graphene may be performed by a dipping or dropping process, for example, a dropping process, in consideration of economic feasibility. In the dropping process, the dopant solution having the above-described concentration with respect to the monolayered graphene (1 cm 1 cm) may be used in a content of from about 0.025 ml to about 0.175 ml in consideration of doping effect and economic feasibility.

When about 0.025 ml of about 0.001 M dopant solution is used for 1 cm$^2$ of graphene, the mole number of the dopant is about 0.000025 mmol. When about 0.175 ml of about 0.1 M dopant solution is used, the mole number of the dopant is about 0.0175 mmol.

After the doping process, a drying process is performed to vaporize an organic solvent. While the drying process may be performed by solely allowing exposure to air, a spin coater may also be utilized for efficient drying.

According to example embodiments, the above method, prior to the doping, may further include treating the graphene with an acid. The acid treatment allows the graphene to have a polarity such that the doping of the graphene is more easily performed. The acid treatment may be performed by immersing the graphene in an acid solution, e.g., a hydrochloric acid, a nitric acid, a sulfuric acid, or a phosphoric acid, or directly spraying or dropping the acid solution onto the graphene, followed by a proper drying process.

The doping of the graphene may be performed following the transferring of the graphene on a transparent substrate. Examples of the transparent substrate may include a plastic substrate and/or a glass substrate.

After the doped graphene is obtained by doping the graphene with a dopant as above, a hydrophobic organic layer may be formed on the doped graphene to thus manufacture a doped graphene structure.

The hydrophobic organic layer may be formed using a liquid phase process or a vapor phase process.

The liquid phase process includes coating a liquid material containing a hydrophobic organic material on a surface of the doped graphene, and the vapor phase process includes vaporizing a hydrophobic organic material and then coating the vaporized organic material on a surface of the graphene.

The liquid phase material means a hydrophobic organic material itself, or a liquid obtained by dissolving or dispersing the hydrophobic organic material in a polar solvent. Examples of the usable solvent with a polar dielectric constant of about 5 or more may include water, nitromethane, dimethylformamide, N-methyl-2-pyrrolidinone, tetrahydrofuran, acetonitrile, dimethyl sulfoxide, and ethanol.

The concentration and content of the hydrophobic organic material-containing liquid phase material may determine the thickness of the hydrophobic organic layer doped into the graphene, and when the thickness of the hydrophobic organic layer is relatively high, a relatively large amount of liquid phase material having a higher concentration may be used.

As described above, by forming the hydrophobic organic layer on a surface of the doped graphene, hydrophobicity may be imparted to the doped graphene. The hydrophobicity may be measured by a contact angle. The contact angle may be defined as an angle between a liquid surface and a solid surface where liquid and solid contact each other. For example, the contact angle may be measured with respect to combinations of various solvents and substrates with a doped graphene transferred thereon.

For example, in the case of a doped graphene structure with the hydrophobic organic layer formed on a surface thereof that is transferred on an inorganic substrate (e.g., SiO$_2$ substrate) or an organic substrate (e.g., polyethylene terephthalate substrate), a contact angle with respect to water may have a range of about 80 degrees to about 170 degrees, or about 90 degrees to about 150 degrees. When compared with a doped graphene not containing a hydrophobic organic layer, and with a contact angle of about 60 degrees, the contact angle may be improved by about 20 degrees or more.

In example embodiments, examples of the substrate on which the graphene is transferred may include an inorganic substrate (e.g., SiO$_2$ substrate), or an organic substrate (e.g., polyethylene terephthalate substrate).

Figure 2:
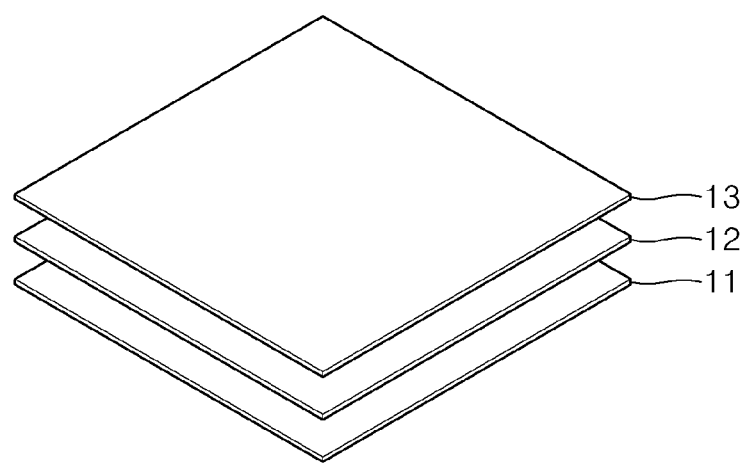
FIG. 2 is a schematic view of a transparent electrode having a doped graphene structure according to example embodiments.

As shown in FIG. 2, the doped graphene structure 12 containing the hydrophobic organic layer 13 is formed on at least one surface of the transparent substrate 11 to constitute a transparent electrode, and a plastic substrate or a glass substrate may be used as the transparent substrate. To impart flexibility enabling bending of the transparent electrode, a transparent flexible substrate may be used as the transparent substrate, and examples of the transparent flexible substrate may include a polyethyleneterephthalate (PET) substrate, a polycarbonate (PC) substrate, a polyimide (PI) substrate, a polyethylene naphthalate (PEN) substrate, a polystyrene (PS) substrate, and a polyether sulfone (PES) substrate.

Because the transparent electrode containing the above-described doped graphene structure has improved optical and electrical properties, and improved stability against moisture and temperature in the air, is the transparent electrode may be usefully employed by various display devices, e.g., an organic electroluminescence device, an electronic paper, and a liquid crystal display device, or a solar cell.

The transparent electrode containing the doped graphene structure may be prepared by methods below. A graphene may be transferred on a transparent substrate to form a transparent electrode, and may be doped with a dopant solution as aforementioned to manufacture a transparent electrode containing a doped graphene. As described herein, by forming a hydrophobic organic layer on the doped graphene, a transparent electrode containing the doped graphene may be prepared.

Figure 3:
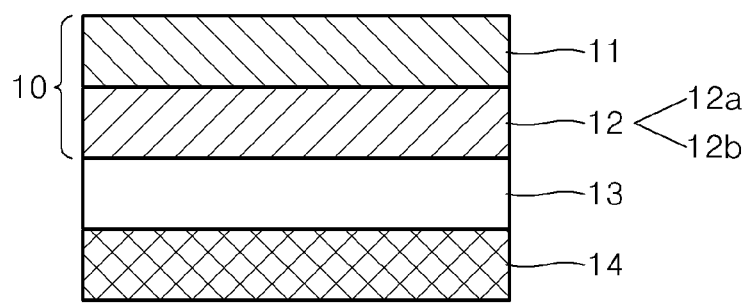
FIG. 3 is a schematic view of a solar cell having a doped graphene structure according to example embodiments.

As shown in FIG. 3, a dye-sensitized solar cell is an example of the solar cell provided with the doped graphene structure, and includes a semiconductor electrode 10, an electrolyte layer 13, and a counter electrode 14, the semiconductor electrode 10 including a conductive transparent substrate 11 and a light absorbing layer 12. The dye-sensitized solar cell is completed by coating a colloidal solution containing a nanoparticle oxide 12a on a conductive glass substrate, heating the resultant glass substrate in a relatively high temperature electric furnace, and allowing a dye 12b to be adsorbed. The transparent electrode may be used as the conductive transparent substrate 11, and may also be applied to the counter electrode 14.

To make the dye-sensitized solar cell have a flexible structure, for example, a cylindrical structure, the counter electrode as well as the transparent electrode may be made of a flexible material.

The nanoparticle oxide 12a used in the solar cell may be a semiconductor fine particle, and may be, for example, an n-type semiconductor that provides an anode current such that electrons in the conduction band become carriers under excitation. Concrete examples of the nanoparticle oxide 12a may include TiO$_2$, SnO$_2$, ZnO$_2$, WO$_3$, Nb$_2$O$_5$, Al$_2$O$_3$, MgO, and TiSrO$_3$, for example, anatase type TiO$_2$. In addition, the metal oxide is not limited to the above-described metal oxides, and the above-mentioned metal oxides may be used alone or in combinations of two or more thereof. For the dye adsorbed to surfaces of the semiconductor fine particles to absorb more light, the surface area of the semiconductor fine particles may be increased to a diameter of not more than 20 nm.

Also, the dye 12b may be used without any limitation if it is typically usable in solar cells and photocells, and may be, for example, a ruthenium complex. Examples of the ruthenium may include (SCN)$_2$, RuL$_2$(H$_2$O)$_2$, RuL$_3$, and RuL$_2$ (where L may be 2,2'-bipyridyl-4,4'-dicarboxylate). However, the dye 12b is not particularly limited if it has a charge separating function and exhibits a sensitized action. In addition to the ruthenium complex, a xanthin pigment (e.g., rhodamine B, rose bengal, eosin, or erythrosine), a cyanine pigment (e.g., quinocyanine or cryptocyanine), a basic dye (e.g., phenosafranine, caribbean blue, thiosyn, or methylene blue), a porphyrin compound (e.g., chloropyl, zinc porphyrin, or magnesium porphyrin), a complex compound (e.g., azo pigment, a phthalocyanine compound, or ruthenium trisbipyridyl), an anthraquinone pigment, and a polycyclic quinone pigment may be used alone, or in combinations of two or more thereof.

The thickness of the light absorbing layer 12 containing the nanoparticle oxide 12a and the dye 12b may be about 15 micron or less, for example, in a range of about 1 to about 15 microns, because the light absorbing layer has a relatively high serial resistance structurally. Because the increase in serial resistance causes a reduction in conversion efficiency, the film thickness of about 15 microns or less reduces the serial resistance while maintaining inherent functions thereof, thereby preventing or inhibiting the conversion efficiency from being reduced.

The electrolyte layer 13 used in the fuel-sensitized solar cell may include, for example, a liquid electrolyte, an ionic liquid electrolyte, an ionic gel electrolyte, a polymer electrolyte, and a composite thereof. Representatively, the electrolyte layer 13 is of an electrolyte liquid including the light absorbing layer 12, or may be formed by allowing an electrolyte liquid to be infiltrated into the light absorbing layer. Examples of the electrolyte liquid may include, but not be limited to, an acetonitrile solution of iodine, and the electrolyte liquid may be used without any limitation if it has a hole conduction function.

Furthermore, the fuel-sensitized solar cell may further include a catalyst layer for promoting an oxidation-reduction reaction thereof, and the catalyst layer may include, for example, platinum (Pt), carbon (C), graphite, carbon nanotube, carbon black, p-type semiconductor, and any composites thereof, and is disposed between the electrolyte layer and the counter electrode. The catalyst layer may have a fine structure for increasing the surface area thereof, and for example, the Pt may be platinum black and the carbon may be porous. The platinum black may be formed by an anode oxidation of platinum, or a chloroplatinic treatment of platinum, and the porous carbon may be formed by annealing of carbon fine particles, or firing of an organic polymer.

The above-described fuel-sensitized solar cell employs a flexible graphene sheet-containing transparent electrode with improved conductivity, light efficiency and processability.

Examples of the display device employing the transparent electrode provided with the doped graphene structure may include an electronic paper display device, an organic light emitting display device, and a liquid crystal display device. Among others, the organic light emitting display device is an active light emitting display device, which uses a phenomenon that when current flows through a fluorescent or phosphorescent organic compound thin film, electrons and holes are combined in an organic film to generate light.

A typical organic electroluminescent device has a structure in which an anode is formed on a substrate, and a hole transport layer, a light emitting layer, an electron transport layer, and a cathode are sequentially formed. To more easily inject electrons and holes, the above organic electroluminescent device may further include an electron injection layer and a hole injection layer, and may further include a hole stop layer and a buffer layer, if necessary. Because the anode may be made of a transparent material having desirable conductivity by the nature thereof, a transparent electrode provided with the doped graphene structure may be used for the anode.

The hole transport layer may be formed of a typical material, e.g., polytriphenylamine or polyoxadiazole, but example embodiments are not limited thereto. A fluorescent or phosphorescent light emitting material usable generally may be used for the light emitting layer without any limitation, and the light emitting layer may further include at least one of one or more polymer hosts, a mixture host of a polymer and a low molecular compound, a low molecular host, and a non-luminescent polymer matrix. All of the polymer host, low molecular host, and non-luminescent polymer matrix may be used as a light emitting material if they are materials typically usable for forming a light emitting layer of an organic electroluminescent device. Examples of the polymer host may include, but not be limited to, poly(vinylcarbazole), polyfluorene, poly(p-phenylene vinylene), and polythiophene. Examples of the low molecular host may include, but not be limited to, CBP (4,4'-N,N'-dicarbazole-biphenyl), 4,4'-bis[9-(3,6-biphenylcarbazolyl)]-1-1,1'-biphenyl{4,4'-bis[9-(3,6-biphenylcarbazolyl)]-1-1,1'-biphenyl}, 9,10-bis[(2',7'-t-butyl)-9', 9''-spirobifluorenyl]anthracene, and tetra-fluorene. Examples of the non-luminescent polymer matrix may include, but not be limited to, polymethylmethacrylate and polystyrene. The above-described light emitting layer may be formed by a vacuum evaporation method, a sputtering method, a printing method, a coating method, or an inject method.

The organic electroluminescent device according to example embodiments may be manufactured not by using a particular apparatus or method but by a typical method of preparing an organic electroluminescent device using a general luminescent material.

Preparation Example 1

Preparation of Graphene Transparent Electrode

A Cu foil (75 μm, available from Wacopa) was loaded in a chamber, thermally annealed for 30 minutes at 1,000° C. at a $H_2$ flow rate of 4 sccm, and naturally cooled at a $CH_4$ flow rate of 20 sccm/$H_2$ flow rate of 4 sccm to form a monolayer graphene in a size of 2 cm 2 cm.

Thereafter, a chlorobenzene solution (5 wt %) containing polymethylmethacrylate (PMMA) dissolved therein was coated on a substrate having the graphene sheet formed thereon for 60 seconds at 1,000 rpm, and the resultant substrate was immersed for 1 hour in an etchant (CE-100, available from Transene Co. Inc.) to remove the Cu foil, thereby separating a graphene sheet attached on PMMA. The graphene sheet attached on PMMA was taken out of the etchant, placed and dried on a plastic substrate (PET, available from DuPoint Teijin), and PMMA was removed from the graphene sheet by using acetone to obtain a transparent electrode including the substrate and the monolayer graphene formed on the substrate.

Example 1

0.4 ml of a 0.01 M TFSI solution, which was prepared by dissolving bis(trifluoromethane)sulfonimide (TFSI) (available from Aldrich) in nitromethane, was coated on the monolayer graphene-containing transparent electrode obtained in Preparation Example 1, and the resultant transparent electrode was left for 5 minutes, and dried for 30 seconds at 2,000 rpm in a spin coater, thereby completing the doping of the graphene into TFSI.

Thereafter, 0.4 ml of a perfluorodecylmethoxy silane solution (Heptadecafluorodecyltrimethoxysilane, $CF_3(CF_2)_7$ $CH_2CH_2Si(OCH_3)_3$, Crystal-Pro FM 1010, available from Nanocrystal CO., LTD, 0.5 vol %, 0.1 ml (FAS)/20 ml (IPA)) was coated on the doped graphene formed on the substrate, and the resultant substrate was left for 30 seconds, and dried for 1 minute at 2,500 rpm in a spin coater to manufacture a transparent electrode having a doped graphene structure containing a hydrophobic organic layer. At this time, a contact angle with respect to water was 96.5°.

Comparative Example 1

0.4 ml of a 0.01 M TFSI solution, which was prepared by dissolving bis(trifluoromethane)sulfonimide (TFSI) (made by Aldrich) in nitromethane, and was coated on the monolayer graphene-containing transparent electrode obtained in Preparation Example 1, and the resultant transparent electrode was left for 5 minutes, and dried for 30 seconds at 2,000 rpm in a spin coater. At this time, a contact angle with respect to water was 63.3°.

Experimental Example 1

Measurement of Sheet Resistance

The transparent electrode obtained in Example 1 was put in an oven maintained at a humidity of 90% and a temperature of 100° C., left for 15 days, and then taken out of the oven to measure a variation rate in sheet resistance. The sheet resistance was shown to be increased by about 2.6%. From this experiment, it was known that the transparent electrode having a doped graphene containing a hydrophobic organic layer according to Example 1 was not substantially reduced in conductivity even under conditions of high temperature and high humidity.

The transparent electrode obtained in Comparative Example 1 was put in an oven maintained at a humidity of 90% and a temperature of 60° C., left for 15 days, and then taken out of the oven to measure a variation rate in sheet resistance. The sheet resistance was shown to be increased by about 66.7%. Because the transparent electrode obtained in Comparative Example 1 did not contain a hydrophobic organic layer, conductivity was considerably reduced even under more favorable conditions than that in Example 1.

Because the doped graphene and the doped graphene structure containing hydrophobic organics have improved stability with respect to moisture and temperature while maintaining a desirable optical property e.g., a relatively high transmittance, degeneration of electrical characteristics of the doped graphene in atmosphere may be suppressed. Also, because the hydrophilic organic layer also functions as a passivation layer to prevent or inhibit the dopants from being decomposed, the degeneration of electrical characteristics in the doped graphene may be further suppressed.

Therefore, the doped graphene structure may be effectively used in a transparent electrode, and a solar cell and a display device provided with the transparent electrode.

It should be understood that the embodiments described therein should be considered in a descriptive sense only and not for purposes of limitation. Descriptions of features or aspects within each embodiment should typically be considered as available for other similar features or aspects in other embodiments.

What is claimed is:

1. A graphene structure comprising:
    a graphene doped with a dopant; and
    a hydrophobic organic layer on at least one surface of the doped graphene,
    wherein the hydrophobic organic layer is made of a fluorocarbon-based material.

2. The graphene structure of claim 1, wherein the dopant is a p-dopant.

3. The graphene structure of claim 2, wherein the p-dopant is at least one selected from $NO_2BF_4$, $NOBF_4$, $NO_2SbF_6$, HCl, $H_3PO_4$, $CH_3COOH$, $H_2SO_4$, $HNO_3$, dichlorodicyanoquinone, potassium peroxymonopersulfate ($2KHSO_5 \cdot KHSO_4 \cdot K_2SO_4$), dimyristoylphosphatidylinositol, trifluoromethanesulfonimide, HPtCl4, $AuCl_3$, $HAuCl_4$, AgOTfs (Silver trifluoromethanesulfonate), $AgNO_3$, $H_2PdCl_6$, $Pd(OAc)_2$, and $Cu(CN)_2$.

4. The graphene structure of claim 2, wherein the p-dopant is at least one of a triflate-based inorganic acid, a trifluorosulfonimide-based inorganic acid, a tetrafluoroborate-based inorganic acid, a perchlorate-based inorganic acid, a hexafluorophosphate-based inorganic acid, a fluoroantimonic acid-based inorganic acid, a silver-based inorganic acid, and a tellurium-based inorganic acid.

5. The graphene structure of claim 2, wherein the p-dopant is at least one of an oxalic acid-based organic acid, a lactic acid-based organic acid, a propionic acid-based organic acid, an acetic acid-based organic acid, a citric acid-based organic acid, and a trifluoroacetate-based organic acid.

6. The graphene structure of claim 1, wherein the hydrophobic organic layer contains a polar functional group.

7. The graphene structure of claim 6, wherein the polar functional group is one of a halogen atom, a substituted or unsubstituted ether group having 1 to 20 carbon atoms, a substituted or unsubstituted alkylcarbonyloxy group having 2 to 20 carbon atoms, a substituted or unsubstituted aryloxy group having 6 to 30 carbon atoms, a carbonyloxy group, a cyano group, an amide group, an imide group, a silyl group, and an alkoxy silane.

8. The graphene structure of claim 1, wherein the hydrophobic organic layer contains at least one of perfluorodecylalkoxy silane, poly(vinylidene fluoride-co-hexafluoropropylene) $F(CF_2)_x(CH_2CH_2O)_yH$ (where x is a number from 2 to 18, and y is a number from 1 to 15), $F(CF_2)_{x'}CH_2CH_2OOCC(CH_3)=CH_2$ (where x' is a number from 2 to 18), $F(CF_2)_{x''}CH_2CH_2OOCC_{17}H_{35}$ (where x" is a number from 2 to 18), and $(F(CF_2)x'''CH_2CH_2OOC)_3C_3H_5O$ (where x''' is a number from 2 to 18).

9. The graphene structure of claim 1, wherein the hydrophobic organic layer has a thickness of about 300 nm or less.

10. The graphene structure of claim 1, wherein the graphene structure has a light transmittance of about 75% or more.

11. The graphene structure of claim 1, wherein the hydrophobic organic layer has a contact angle ranging from about 80° to about 170° with respect to water on a surface thereof.

12. A transparent electrode comprising:
    a transparent substrate; and
    the graphene structure of claim 1 on at least one surface of the transparent substrate.

13. A solar cell comprising the transparent electrode of claim 12.

14. A display device comprising the transparent electrode of claim 12.

15. The graphene structure of claim 1, wherein the hydrophobic organic layer and the doped graphene are made of different materials.

16. A method of preparing a graphene structure, the method comprising:
    doping a graphene layer with a dopant solution; and
    forming a hydrophobic organic layer on the doped graphene layer by using a fluorocarbon-based material.

17. The method of claim 16, wherein the hydrophobic organic layer and the doped graphene are made of different materials.

18. A method of preparing a transparent electrode, the method comprising:
    transferring a graphene on at least one surface of a transparent substrate;
    doping the graphene with a dopant solution; and
    forming a hydrophobic organic layer on the doped graphene by using a fluorocarbon-based material.

19. A method of preparing a solar cell comprising the method of claim 18.

20. A method of preparing a display device comprising the method of claim 18.

21. The method of claim 18, wherein the hydrophobic organic layer and the doped graphene are made of different materials.

* * * * *